United States Patent [19]

Kotaki et al.

[11] Patent Number: 5,281,830
[45] Date of Patent: Jan. 25, 1994

[54] LIGHT-EMITTING SEMICONDUCTOR DEVICE USING GALLIUM NITRIDE GROUP COMPOUND

[75] Inventors: Masahiro Kotaki, Inazawa; Isamu Akasaki, Nagoya; Hiroshi Amano, Hamamatsu, all of Japan

[73] Assignees: Toyoda Gosei Co., Ltd., Nishikasugai; Nagoya University, Nagoya; Research Development Corporation of Japan, Tokyo, all of Japan

[21] Appl. No.: 781,910
[22] Filed: Oct. 24, 1991

[30] Foreign Application Priority Data

Oct. 27, 1990 [JP] Japan .................. 2-290058
Oct. 27, 1990 [JP] Japan .................. 2-290059

[51] Int. Cl.$^5$ .......................................... H01L 33/00
[52] U.S. Cl. .................................... 257/86; 257/91; 257/94; 257/99; 257/103; 257/621; 257/622
[58] Field of Search ............... 257/99, 103, 86, 91, 257/94, 621, 622

[56] References Cited

U.S. PATENT DOCUMENTS

| | | | |
|---|---|---|---|
| 4,316,208 | 2/1982 | Kobayashi | 357/55 |
| 4,408,217 | 10/1983 | Kobayashi et al. | |
| 4,428,217 | 10/1983 | Kobayashi et al. | 357/17 |
| 4,855,249 | 8/1989 | Akasaki et al. | |
| 4,911,102 | 3/1990 | Manabe et al. | |
| 4,946,548 | 8/1990 | Kotaki et al. | |

FOREIGN PATENT DOCUMENTS

| | | |
|---|---|---|
| 0277597 | 8/1988 | European Pat. Off. |
| 2-257679 | 10/1980 | Japan |
| 62-119196 | 5/1987 | Japan |
| 63-188977 | 8/1988 | Japan |
| 2-42770 | 2/1990 | Japan |
| 2-257678 | 10/1990 | Japan |

OTHER PUBLICATIONS

H. Amano, et al., "Stimulated Emission Near Ultraviolet at Room Temperature from a GaN Film Grown on Sapphire by MOVPE Using an AlN Buffer Layer", Japanese Journal of Applied Physics, vol. 29, No. 2, Feb., 1990, pp. 81-82.
H. Amano, et al., "P-Type Conduction in Mg-Doped GaN Treated with Low-Energy Electron Beam Irradiation (LEEBI)", JJAP, vol. 28, No. 12, Dec. 1989, pp. 2122-2114.
Patent Abstracts of Japan, vol. 15, No. 3, Jan. 1991 UP-A-2 257 679 Oct. 1990 English Abstract.
Patent Abstracts of Japan, vol. 14, No. 263 Jun. 1990, JP-A-2 081 483 Mar. 1990, English Abstract.
H. Amano, et al., "Growth and Luminescence Properties of Mg-Doped GaN Prepared by MOVPE, Journal of the Electrochemical Society", vol. 137, No. 5, May 1990, pp. 1639-1641.
Patent Abstracts of Japan, vol. 14, No. 200, Apr. 1990 JP-A-2 042 770 Feb. 1990, English Abstract.
I. Akasaki, et al., "Effects of AlN Buffer Layer on Crystallographic Structure And On Electrical And Optical Properties of GaN and $Ga_{1-x}Al_xN$ ($P < x \leq 0.4$) Films Grown On Sapphire Substrate by MOVPE", Journal of Crystal Growth, Nov. 1989, pp. 209-219.
T. Akasaki, et al., "High efficiency UV and blue emitting devices prepared by MOVPE and low energy electron beam irradiation treatment", SPIE vol. 1361, Oct. 1990 pp. 138-149.

Primary Examiner—Edward Wojciechowicz
Attorney, Agent, or Firm—Cushman, Darby & Cushman

[57] ABSTRACT

There are disclosed two types of gallium nitride LED having the pn junction. An LED of gallium nitride compound semiconductor ($Al_xGa_{1-x}N$, where $0 \leq x < 1$) comprises an n-layer; a p-layer which exhibits p-type conduction upon doping with p-type impurities and irradiation with electron rays, the p-layer joining to the n-layer; a first electrode for the n-layer so as to join to the n-layer, passing through a hole formed in the p-layer which extends from the p-layer to the n-layer; and a second electrode for the p-layer which is formed in a region which is separated by a groove formed in the p-layer so as to extend from the upper surface of the p-layer to said n-layer. An LED comprises an n-layer; an i-layer doped with p-type impurities, the i-layer joining to the n-layer; a first electrode for said n-layer so as to join to the n-layer, passing through a hole formed in the i-layer which extends from the upper surface of the i-layer to the n-layer; a p-type part in a specific region in the i-layer which is converted into p-type conduction by irradiating with electron rays, the p-type part being formed such that said first electrode is insulated and separated by the i-layer; and a second electrode for said p-type part.

6 Claims, 8 Drawing Sheets

LIGHT-EMITTING SEMICONDUCTOR DEVICE USING GALLIUM NITRIDE GROUP COMPOUND

BACKGROUND OF THE INVENTION

1. Field of the Invention

The present invention relates to a light-emitting semiconductor device using gallium nitride group compound which emits a light in the region from blue to ultraviolet, and also to a process for producing the same.

2. Description of the Prior Art

It is known that GaN compound semiconductor can be made into a light-emitting semiconductor device, such as a light-emitting diode (LED), which emits a blue light.

The GaN compound semiconductor attracts attention because of its high light-emitting efficiency resulting from a direct transition and of its ability to emit a blue light which is one of the three primary colors.

The light-emitting diode of GaN compound semiconductor is composed of a sapphire substrate, an n-layer and an i-layer grown thereon. The n-layer of the GaN compound semiconductor with n-type conduction is directly grown on the surface of the sapphire substrate or grown on a buffer layer of aluminum nitride formed on the sapphire substrate. The i-layer of semi-insulating (i-type) GaN compound semiconductor is doped with p-type impurities. (See Japanese Patent Laid-open Nos. 119196/1987 and 188977/1988.)

The voltage for driving this light-emitting diode, however, is high. Consequently, there is room for improvement.

Another disadvantage of the gallium nitride compound semiconductor is that it does not become p-type but remains i-type (semi-insulator) even though it is doped with p-type impurities.

As the results of extensive studies, the present inventors succeeded in producing a p-type gallium nitride compound semiconductor. This led to the creation of a pn junction that emits a blue light efficiently.

The light-emitting diode comprising the pn junction, however, presents a problem associated with insulating the electrode for a lower layer from an upper layer in case that the electrode for the lower layer is formed through the upper layer to get the electrode on the upper layer, because the p-layer and n-layer are electrically conductive.

SUMMARY OF THE INVENTION

The present invention was completed to solve this problem. It is an object of the present invention to provide a light-emitting semiconductor device using gallium nitride group compound which has a new pn junction and a new structure for leading the electrodes. This light-emitting device operates at a lower voltage.

According to an embodiment of the present invention, the pn junction is made of gallium nitride compound semiconductor ($Al_xGa_{1-x}N$, where $0 \leq x < 1$) and the electrodes for the p-layer and n-layer are led from either p-layer or n-layer, whichever upper.

The p-layer of gallium nitride compound semiconductor is formed in the following manner. First, gallium nitride compound semiconductor is formed by a vapor phase epitaxy. During the vapor phase epitaxy, the gallium nitride compound semiconductor is doped with p-type impurities to form a semi-insulating i-layer. The i-layer is irradiated with electron rays to form the p-layer of p-type semiconductor. The p-layer is jointed with the n-layer to form the pn junction. The respective electrodes for the p-layer and n-layer are formed on the upper layer. The electrode for the lower layer is connected through a hole made in the upper layer.

The upper layer has a groove formed therein which electrically insulates and separates the hole and the electrode for the lower layer formed through the hole. The electrode for the upper layer is formed in the region separated by the groove and opposite to the other electrode.

The p-layer is doped with, for example, magnesium (Mg). Simple doping gives rise to an i-type (insulating) semiconductor, and the i-type layer changes into the p-layer upon irradiation with electron rays. This irradiation is carried out at an acceleration voltage of 1 Kv to 50 Kv and a sample current of 0.1 $\mu$A to 1 mA.

Because of the pn junction realized for the first time by the present inventors, it is possible to lower the operating voltage and to improve the light-emitting efficiency and the light intensity.

In addition, with the groove formed in the upper layer, it is possible to electrically insulate and separate the upper layer from the electrode for the lower layer.

The above-mentioned structure makes it possible to produce a light-emitting device having the pn junction and the bump connection (with face down) formed for both electrodes on the upper layer.

According to another embodiment of the present invention, a p-layer of gallium nitride compound semiconductor ($Al_xGa_{1-x}N$, where $0 \leq x < 1$) is formed on an n-layer, and part of the i-layer is converted into p-type, so that a partial pn junction is formed, and the electrodes for both layers are led from the upper i-layer. This structure is produced in the following manner.

First, an n-layer is formed from an n-type gallium nitride compound semiconductor. An i-layer of gallium nitride compound semiconductor doped with p-type impurities is formed on the n-layer. Upon doping with the p-type impurities, the gallium nitride compound semiconductor becomes an insulator although it does not change into p-type.

The electrode for the n-layer is formed on the surface of the i-layer through a hole formed in the i-layer so that the hole reaches the n-layer. A p-type part is formed on the specific region of the i-layer so that the electrode for the n-layer is insulated and separated by the i-layer. The p-type part is formed by irradiating the specific region of the i-layer with electron rays. In other words, the i-type (insulating) gallium nitride compound semiconductor decreases in resistance upon irradiation with electron rays, changing into a p-type semiconductor. The thus converted p-layer and the lower n-layer form the pn junction. An electrode for the p-type part is formed on this p-type part.

Thus the electrode for the lower n-layer is insulated and separated from the p-type part by the i-layer.

The i-layer is doped with, for example, magnesium (Mg). The irradiation is carried out at an acceleration voltage of 1 kV to 50 kV and a sample current of 0.1 $\mu$A to 1 mA.

Because of the pn junction realized for the first time by the present inventors as mentioned above, it is possible to lower the operating voltage.

As mentioned above, the electrode for the lower n-layer is insulated and isolated from the p-layer by the i-layer. This structure makes it possible to produce a light-emitting device having the bump connection (with face down) formed for both electrodes on the upper p-layer and i-layer.

DETAILED DESCRIPTION OF THE PREFERRED EMBODIMENTS

The invention will be described in more detail with reference to the following examples.

EXAMPLE 1

Figure 1:
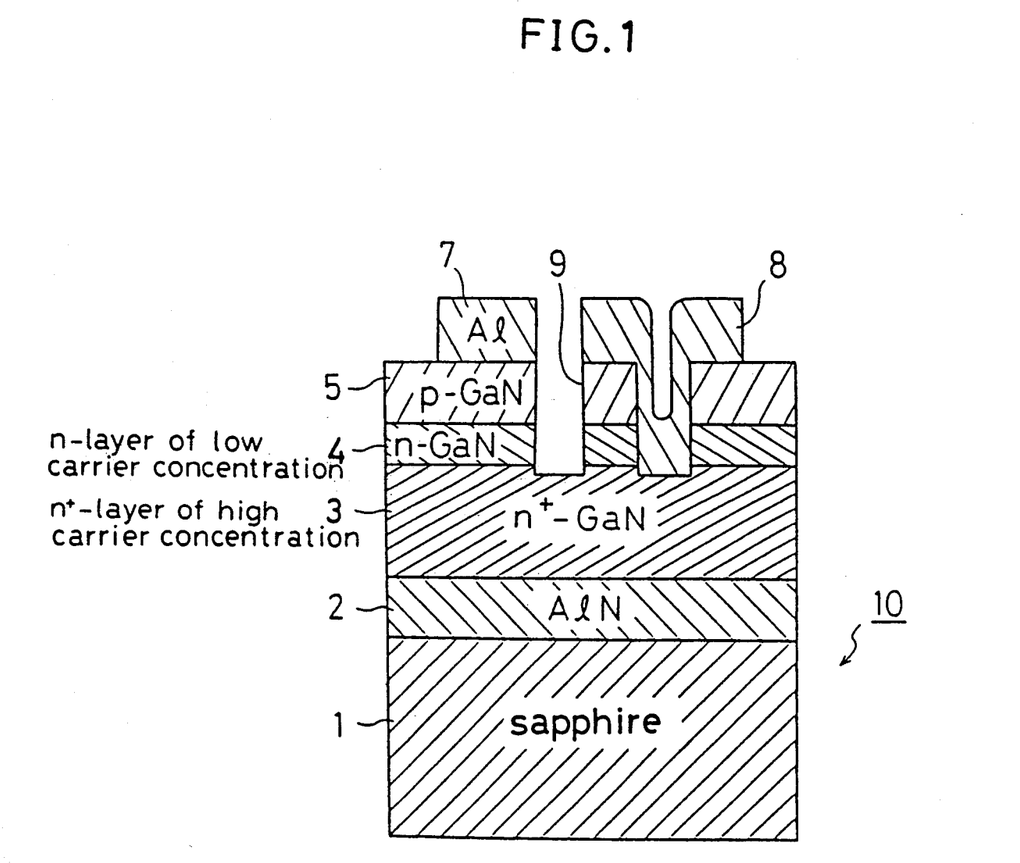
FIG. 1 is a schematic representation showing a structure of a light-emitting diode according to a first embodiment of the present invention.

A light-emitting diode 10 as shown in FIG. 1 is composed of a sapphire substrate 1 and several layers formed thereon which include a 500 Å thick buffer layer 2 of AlN, a 2.2 $\mu$m thick n$^+$-layer 3 of GaN with a high carrier concentration, a 1.5 $\mu$m thick n-layer 4 of GaN with a low carrier concentration and a 0.2 $\mu$m thick p-layer 5 of GaN. An electrode 7 of aluminum is in contact with the p-layer 5, and an electrode 8 of aluminum is in contact with the n$^+$-layer 3. The electrodes 7 and 8 separated from each other by a groove 9.

The light-emitting diode 10 of the above-mentioned structure was produced by the metalorganic vapor phase epitaxy (MOVPE) in the following manner. This process employed NH$_3$, H$_2$ (carrier gas), trimethyl gallium Ga(CH$_3$)$_3$ (TMG), trimethyl aluminum Al(CH$_3$)$_3$ (TMA), silane SiH$_4$, and cyclopentadienyl magnesium Mg(C$_5$H$_5$)$_2$ (CP$_2$Mg).

The process started with cleaning the single crystal sapphire substrate by washing with an organic solvent and by heat treatment. The cleaned sapphire substrate 1 whose principal surface was a-surface {1120} was placed on the susceptor mounted in a reaction chamber of an MOVPE apparatus. The sapphire substrate 1 underwent vapor phase etching at 1100° C. with hydrogen flowing through the reaction chamber at a rate of 2 liters/min under normal pressure. The reaction chamber in which the temperature was lowered at 400° C. was supplied with H$_2$ at a flow rate of 20 liters/min, NH$_3$ at a flow rate of 10 liters/min, and TMA at a flow rate of $1.8 \times 10^{-5}$ mol/min, so as to form the 500 Å thick buffer layer 2 of AlN.

With the sapphire substrate 1 kept at 1150° C., the reaction chamber was supplied with H$_2$ a flow rate of 20 liters/min, NH$_3$ at a flow rate of 10 liters/min, TMG at a flow rate of $1.7 \times 10^{-4}$ mol/min, and silane SiH$_4$ (diluted to 0.86 ppm with H$_2$) at a flow rate of 200 ml/min for 30 minutes, so as to form the 2.2 $\mu$m thick n$^+$-layer 3 of GaN with a high carrier concentration ($1.5 \times 10^{18}$/cm$^3$).

With the sapphire substrate 1 kept at 1150° C., the reaction chamber was supplied with H$_2$ at a flow rate of 20 liters/min, NH$_3$ at a flow rate of 10 liters/min, and TMG at a flow rate of $1.7 \times 10^{-4}$ mol/min for 20 minutes, so as to form the 1.5 $\mu$m thick n-layer 4 of GaN with a low carrier concentration ($1 \times 10^{15}$/cm$^3$).

With the sapphire substrate 1 kept at 900° C., the reaction chamber was supplied with H$_2$ at a flow rate of 20 liters/min, NH$_3$ at a flow rate of 10 liters/min, TMG at a flow rate of $1.7 \times 10^{-4}$ mol/min, and CP$_2$Mg at a flow rate of $3 \times 10^{-6}$ mol/min for 3 minutes, so as to form the 0.2 $\mu$m thick i-layer 5 of GaN. The i-layer 5 as such is an insulator.

The i-layer 5 was uniformly irradiated with electron rays using a reflection electron diffraction apparatus. The conditions for irradiation are as follows: Acceleration voltage: 10 kV, sample currents 1 $\mu$A, beam moving rate: 0.2 mm/sec, beam diameter: 60 $\mu$m$\phi$, and vacuum: $2.1 \times 10^{-5}$ Torr. This irradiation changed the i-layer 5 which was an insulator having a resistivity greater than 10$^8$ $\Omega$cm into a conducting semiconductor having a resistivity of 40 $\Omega$cm. In this way, there was obtained the p-layer 5 which exhibits the p-type electric conduction.

Figure 2:
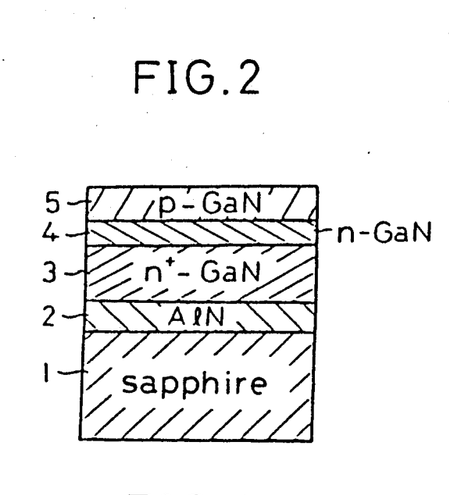
FIGS. 2 to 7 are sectional views showing the process of producing the light-emitting diode according to a first embodiment of the present invention.

The wafer of multi-layered structure as shown in FIG. 2 was obtained by the above-mentioned steps. This wafer had many same elements which would be separated from one another later to make many chips. FIGS. 3 to 7 are sectional views of a single device formed on the wafer.

Figure 3:
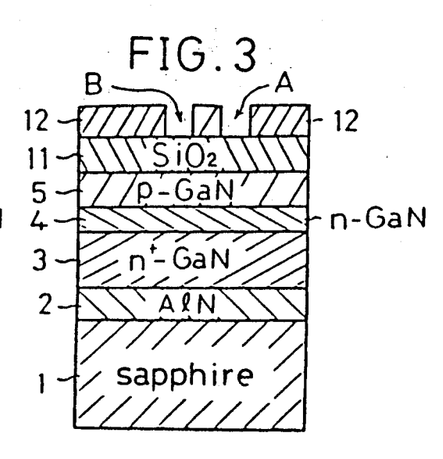

A 2000 Å thick SiO$_2$ layer 11 was formed on the p-layer 5 by sputtering as shown in FIG. 3. The SiO$_2$ layer 11 was coated with a photoresist 12. The photoresist layer 12 was removed at positions A and B by photolithography. The position A is where a hole 15 is to be formed which reaches the n$^+$-layer 3 of high carrier concentration. (In the hole 15 is formed later an electrode.) The position B is where a groove 9 is to be formed which separates said electrode forming part from the electrode for the p-layer 5.

Figure 4:
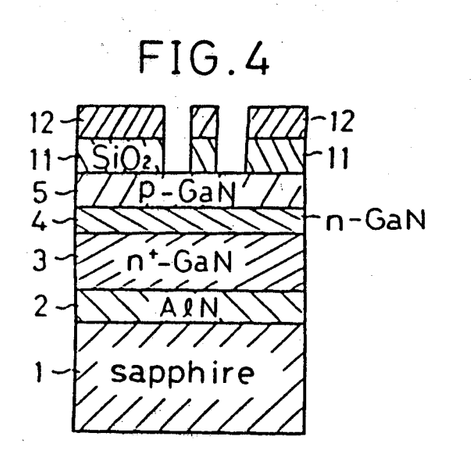

The exposed parts of the SiO$_2$ layer 11 which are not covered by the photoresist 12 were removed by etching with hydrofluoric acid, as shown in FIG. 4.

Figure 5:
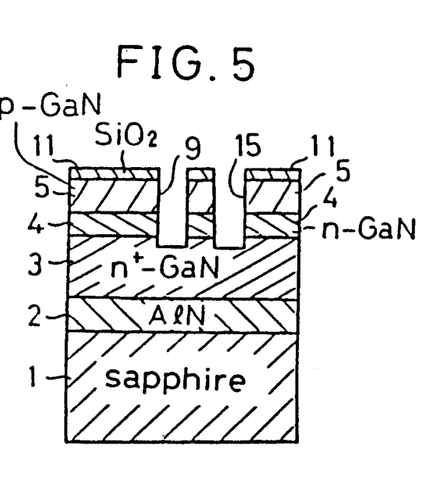

The exposed parts of the p-layer 5 and n-layer 4 of low carrier (which are not covered by the photoresist 12 and SiO$_2$ layer 11) underwent dry etching with CCl$_2$F$_2$ with Ar at a flow rate of 10 ml/min at 0.04 Torr and at a high-frequency power, 0.44 W/cm$^2$ and thereafter successively underwent dry etching as shown in FIG. 5. This dry etching was carried out till the upper surface of the n$^+$-layer 3 was partly removed. A hole 15 for the electrode leading to the n$^+$-layer 3 and a groove 9 for insulation and separation were formed by this step.

Figure 6:
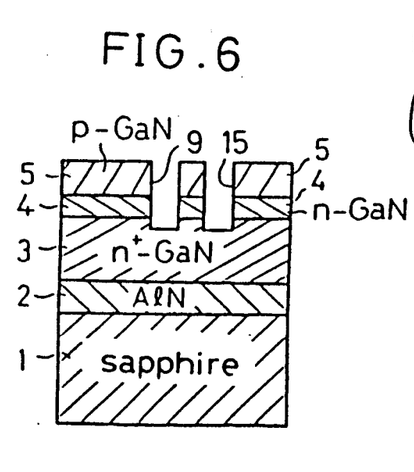

The SiO$_2$ layer 11 remaining on the p-layer 5 was removed by etching with hydrofluoric acid, as shown in FIG. 6.

Figure 7:
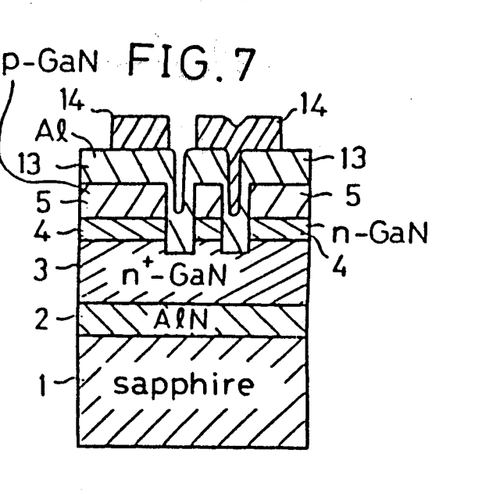

The upper surface of the sample was entirely covered with an Al layer 13 by vapor deposition, as shown in FIG. 7. The Al layer 13 was electrically connected to the n$^+$-layer 3 through the hole 15.

The Al layer 13 was coated with a photoresist 14, which was subsequently patterned by photolithography so that the electrode leading to the n$^+$-layer 3 and p-layer 5 remained.

The exposed part of the Al layer 13 not covered with the photoresist 14 underwent etching with nitric acid, with the photoresist 14 as a mask, as shown in FIG. 7. This etching completely removed the Al layer 13 formed by deposition on the inside of the groove 9. The photoresist 14 was removed with acetone. There remained the electrode 8 for the n+-layer 3 and the electrode for the p-layer 5.

After the above-mentioned steps, the wafer was cut into individual chips. Thus there was obtained a gallium nitride light-emitting diode having the pn junction structure, as shown in FIG. 1.

Figure 8A:
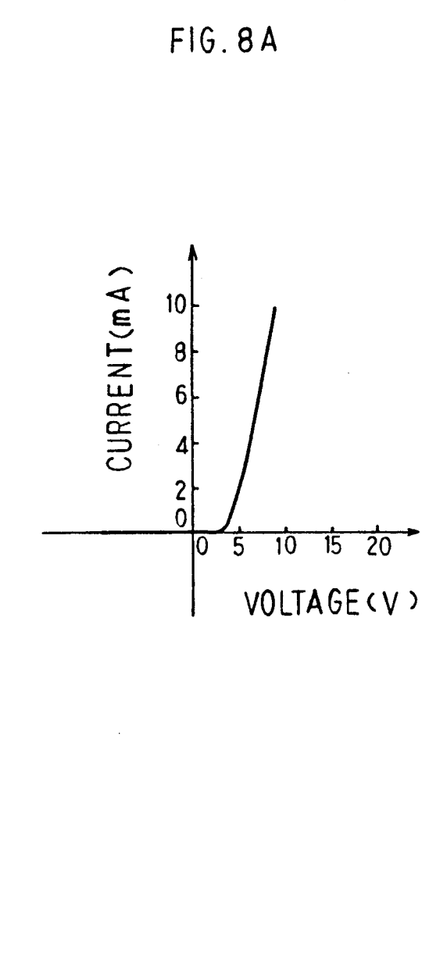
FIGS. 8A and 8B are graphs showing measured V-I characteristics of the pn type LED described in Example 1 and a MIS type LED, respectively.
Figure 8B:
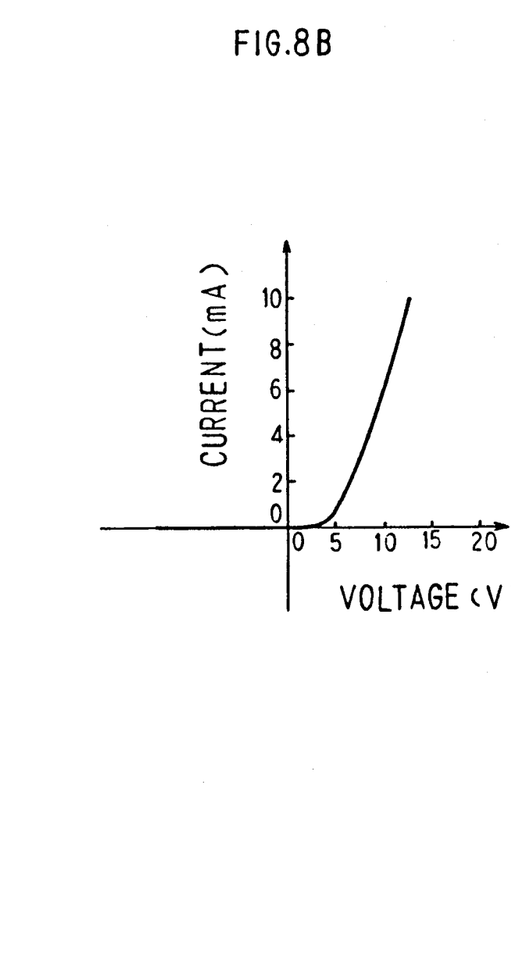

The voltage-current (V-I) characteristics of the light-emitting diode (pn junction type LED) 10 produced as mentioned above was measured. The result is shown in FIG. 8A. On the contrary the V-I characteristics of a conventional MIS (metal insulator semiconductor) type LED having an n-layer and a semi-insulating i-layer was measured. The result is shown in FIG. 8B. From the FIGS. 8A and 8B it is known that the drive voltage at a drive current of 10 mA is about 8 volts in the pn junction type LED and the drive voltage is about 13 volts in the MIS type LED. Accordingly, the drive voltage is lower in the pn junction type LED than in the MIS type LED. From many measurements for many samples of the pn and MIS type LED's it was observed that the drive voltages of the pn type LED's little fluctuate but the drive voltages concerning the MIS type LED's fluctuate from 10 V to 15 V.

The magnesium doping gas used in the above-mentioned embodiment may be replaced by methylcyclopentadienyl magnesium Mg $(C_5H_5)CH_3$.

In the above-mentioned embodiment, the n-layer is of double-layer structure composed of the n+-layer 3 of high carrier concentration and the n-layer 4 of low carrier concentration. However, these two layers may be replaced by a single n-layer.

In the case of the double-layer structure, the n-layer 4 of low carrier concentration should preferably have a carrier concentration of $1 \times 10^{14}$ to $1 \times 10^{17}/cm^3$ and a thickness of 0.5 to 2 μm. With a carrier concentration higher than $1 \times 10^{17}/cm^3$, the light-emitting diode decreases in light intensity. With a carrier concentration lower than $1 \times 10^{14}/cm^3$, the light-emitting diode radiates heat because of the increased serial resistance. With a thickness greater than 2 μm, the light-emitting diode radiates heat because of the increased serial resistance. With a thickness smaller than 0.5 μm, the light-emitting diode decreases in light intensity.

In addition, the n+-layer 3 should preferably have a carrier concentration of $1 \times 10^{17}$ to $1 \times 10^{19}/cm^3$ and a thickness of 2 to 10 μm. A carrier concentration higher than $1 \times 10^{19}/cm^3$ is not desirable because crystal property becomes poor. With a carrier concentration lower than $1 \times 10^{17}/cm^3$, the light-emitting diode radiates heat because of the increased serial resistance. A layer thickness greater than 10 μm would cause the substrate to warp. With a layer thickness smaller than 2 μm, the light-emitting diode radiates heat because of the increased serial resistance.

EXAMPLE 2

Figure 9:
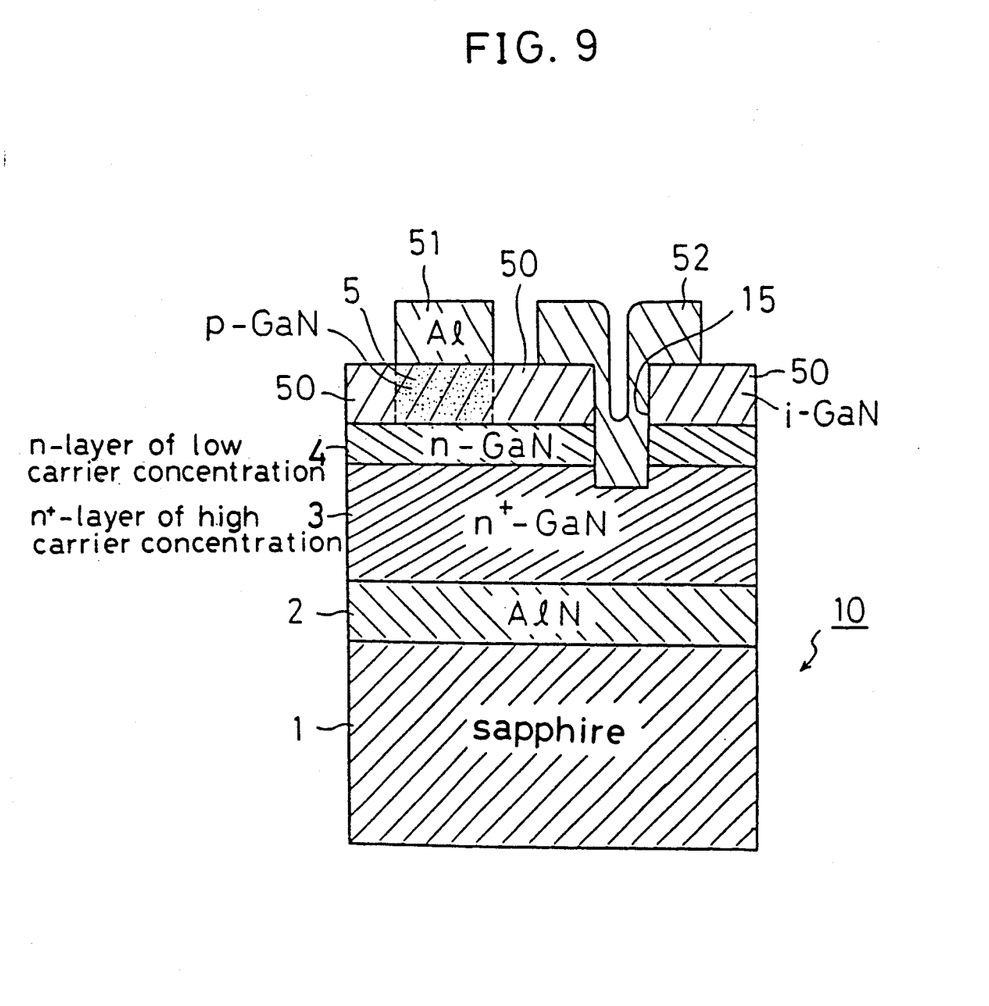
FIG. 9 is a sectional view showing a structure of a light-emitting diode according to a second embodiment of the present invention.
Figure 10:
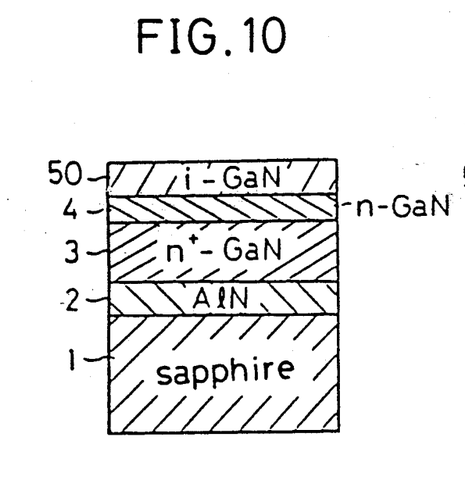
FIGS. 10 to 16 are sectional views showing the process of producing the light-emitting diode according to a second embodiment of the present invention.

A light-emitting diode 10 as shown in FIG. 9 is composed of a sapphire substrate 1 and several layers formed thereon which include a 500 Å thick buffer layer 2 of AlN, a 2.2 μm thick n+-layer 3 of GaN with a high carrier concentration, a 1.5 μm thick n-layer 4 of GaN with a low carrier concentration, a 0.2 μm thick i-layer 50 of GaN, and a p-layer 5 which exhibits the p-type electric conduction. The p-layer 5 is formed in a part of the i-layer 50.

There is a hole 15 which passes through the i-layer 50 and the n-layer 4 of low carrier concentration, reaching the n+-layer 3 of high carrier concentration. There is an electrode 52 of aluminum which is formed on the i-layer 50 and is connected to the n+-layer 3 of high carrier concentration through the hole 15. On the p-layer 5 is formed an electrode 51 of aluminum for the p-layer 5. The electrode 52 for the n+-layer 3 of high carrier concentration is insulated and separated from the p-layer 5 by the i-layer 50.

The light-emitting diode 10 of the above-mentioned structure was produced by MOVPE in the following manner. This process employed NH$_3$, H$_2$ (carrier gas), TMG, TMA, silane SiH$_4$, and CP$_2$Mg.

The following steps gave rise to a wafer of multi-layered structure as shown in FIG. 9. This wafer was processed into a multiplicity of elements which were separated from one another later. FIGS. 10 to 16 are sectional views of a single device formed on the wafer.

The process started with cleaning a single-crystal sapphire substrate by washing with an organic solvent and by heat treatment. The cleaned sapphire substrate 1 (whose a-plane is the principal surface) was placed on the susceptor mounted in the reaction chamber of the MOVPE apparatus. The sapphire substrate 1 underwent vapor phase etching at 1100° C. with hydrogen flowing through the reaction chamber at a rate of 2 liters/min under normal pressure. The reaction chamber in which the temperature was lowered at 400° C. was supplied with H$_2$ at a flow rate of 20 liters/min, NH$_3$ at a flow rate of 10 liters/min, and TMA at a flow rate of $1.8 \times 10^{-5}$ mol/min, so as to form a 500 Å thick buffer layer 2 of AlN.

With the sapphire substrate 1 kept at 1150° C., the reaction chamber was supplied with H$_2$ at a flow rate of 20 liters/min, NH$_3$ at a flow rate of 10 liters/min, TMG at a flow rate of $1.7 \times 10^{-4}$ mol/min, and silane SiH$_4$ (diluted to 0.86 ppm with H$_2$) at a flow rate of 200 ml/min for 30 minutes, so as to form a 2.2 μm thick n+ layer 3 of GaN with a high carrier concentration $(1.5 \times 10^{18}/cm^3)$.

With the sapphire substrate 1 kept at 1150° C., the reaction chamber was supplied with H$_2$ at a flow rate of 20 liters/min, NH$_3$ at a flow rate of 10 liters/min, and TMG at a flow rate of $1.7 \times 10^{-4}$ mol/min for 20 minutes, so as to form a 1.5 μm thick n-layer 4 of GaN with a low carrier concentration $(1 \times 10^{15}/cm^3)$.

With the sapphire substrate 1 kept at 900° C., the reaction chamber was supplied with H$_2$ at a flow rate of 20 liters/min, NH$_3$ at a flow rate of 10 liters/min, TMG at a flow rate of $1.7 \times 10^{-4}$ mol/min, and CP$_2$Mg at a flow rate of $3 \times 10^{-6}$ mol/min for 3 minutes, so as to form a 0.2 μm thick i-layer 50 of GaN. The i-layer 5 as such was an insulator.

Figure 11:
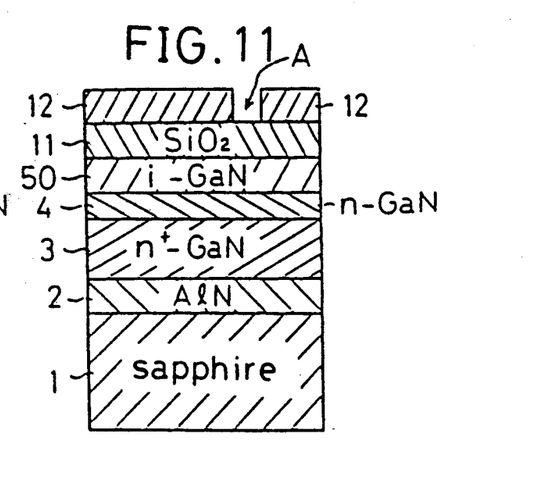
Figure 12:
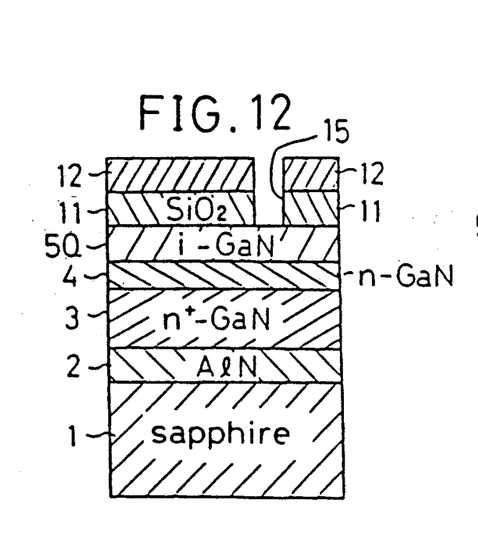

On the i-layer 50 was formed an SiO$_2$ layer 11 (2000 Å thick) by sputtering, as shown in FIG. 11. The SiO$_2$ layer 11 was coated with a photoresist 12. The photoresist at position A was removed by photolithography, where a hole 15 was to be formed later which passed through the i-layer 50 and the n-layer 4. The exposed part of the SiO$_2$ layer 11 (which was not covered by the photoresist 12) was removed by etching with hydrofluoric acid, as shown in FIG. 12.

Figure 13:
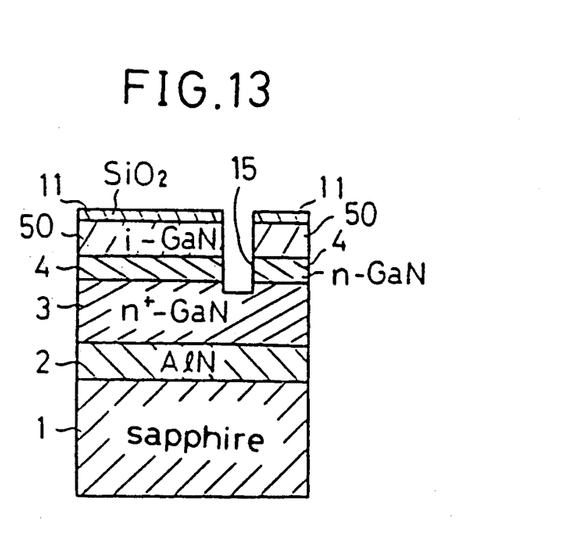

The exposed parts of the i-layer 50 and n-layer 4 (which are not covered by the photoresist 12 and the SiO$_2$ layer 11) underwent dry etching with CCl$_2$F$_2$ at a flow rate of 10 ml/min at 0.04 Torr and 0.44 W/cm$^2$ (high-frequency power) and thereafter successively dry etching with Ar. This dry etching was carried out till the surface of the n$^+$-layer 3 was etched. A hole 15 for the electrode leading to the n$^+$-layer 3 was formed by this step, as shown in FIG. 13.

Figure 14:
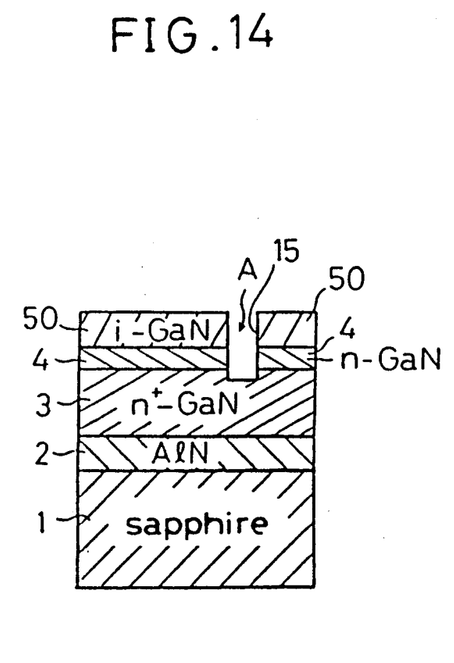

The SiO$_2$ layer 11 remaining on the i-layer 50 was removed by etching with hydrofluoric acid, as shown in FIG. 14.

Figure 15:
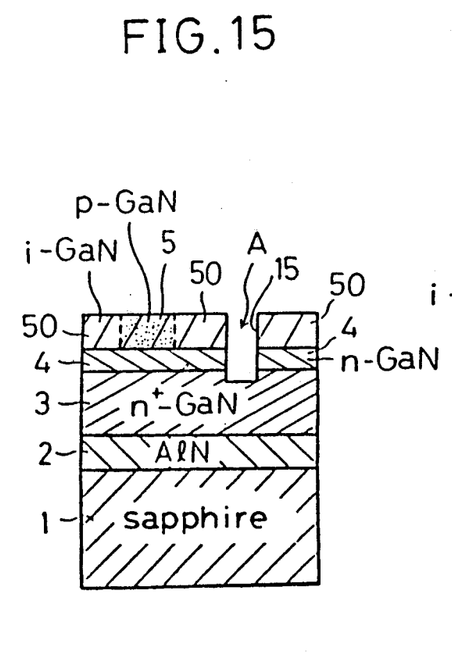

The i-layer 50 was locally irradiated with electron rays using a reflection electron diffraction apparatus to form a p-type part 5 which was p-type semiconductor, as shown in FIG. 15. The conditions for irradiation were as follows: Acceleration voltage: 10 kV, sample current: 1 μA, beam moving rate: 0.2 mm/sec, beam diameter: 60 μmφ, and vacuum: 2.1×10$^{-5}$ Torr. This irradiation changed the i-layer 50 (which was an insulator having a resistivity greater than 10$^8$ Ωcm) into a p-type semiconductor having a resistivity of 35 Ωcm. The part other than the p-type part 5 (i.e., the part which was not irradiated with electron rays) remained the i-layer 50 which was an insulator. Therefore, the p-type part 5 formed the pn junction with the n-layer 4 in the vertical direction; but it was electrically isolated and insulated from its surrounding by the i-layer 50 in the horizontal direction.

Figure 16:
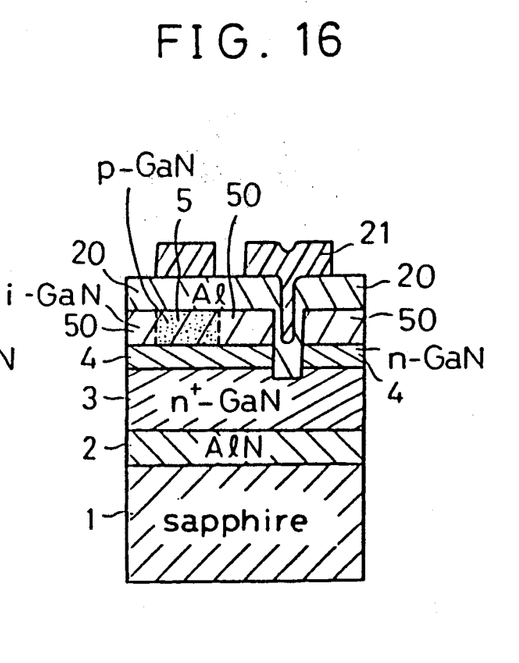

An Al layer 20 was formed to cover the p-type part 5, the i-layer 50, and the inside of the hole 15, as shown in FIG. 16. The Al layer 20 was coated with a photoresist layer 21, which was to be subsequently patterned by photolithography so that electrodes for the n$^+$-layer 3 and the p-type part 5 remained unetched.

The exposed part of the Al layer 20 underwent etching with nitric acid, with the photoresist 21 as a mask. The photoresist 21 was removed with acetone. In this way there were formed the electrode 52 for the n$^+$-layer 3 and the electrode 51 for the p-type part 5, as shown in FIG. 9. After the above-mentioned steps, the wafer was cut into individual elements.

Figure 17A:
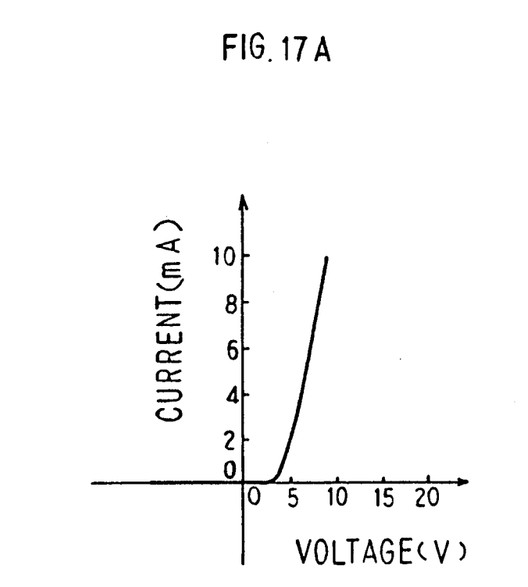
FIGS. 17A and 17B are graphs showing measured V-I characteristics of the pn type LED described in Example 2 and a MIS type LED, respectively.
Figure 17B:
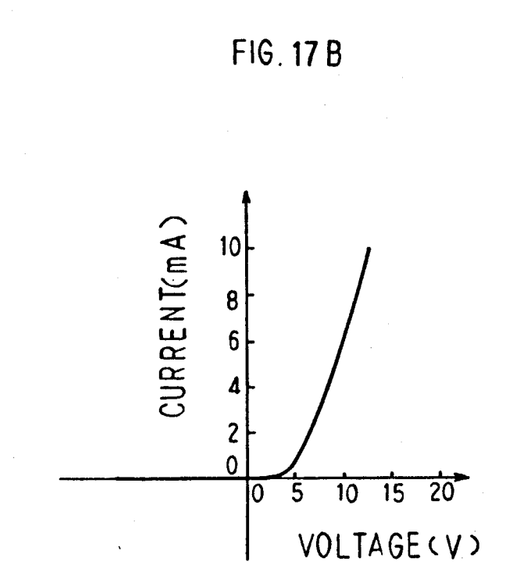

The V-I characteristics of the light-emitting diode (pn junction type LED) 10 produced as mentioned above was measured as well as in the example 1. The result is shown in FIG. 17A. The V-I characteristics of a conventional MIS type LED having an n-layer and a semi-insulating i-layer is shown in FIG. 17B. From the FIGS. 17A and 17B it is known that the drive voltage at a drive current of 10 mA is about 8 volts in the pn junction type LED and the drive voltage is about 13 volts in the MIS type LED. Accordingly, the drive voltage is lower in the pn junction type LED than in the MIS type LED. From many measurements for many samples of the pn and MIS type LED's it was observed that the drive voltages of the pn type LED's little fluctuate but the drive voltages concerning the MIS type LED's fluctuate from 10 V to 15 V.

The magnesium doping gas used in the above-mentioned embodiment may be replaced by methylcyclopentadienyl magnesium Mg (C$_5$H$_5$)CH$_3$.

EXAMPLE 3

Figure 18:
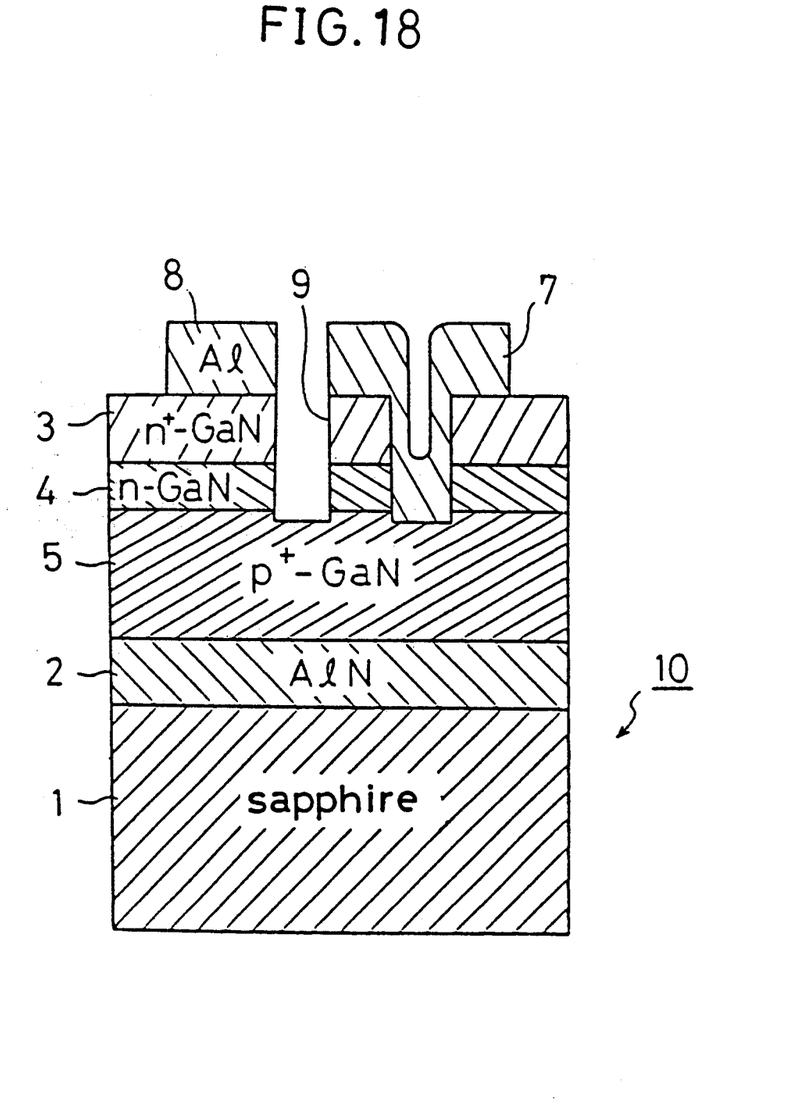
FIG. 18 is a sectional view showing a structure of a light-emitting diode according to a third embodiment of the present invention.

A light-emitting diode 10 as shown in FIG. 18 is composed of a sapphire substrate 1 and several layers formed thereon which include a 500 Å thick buffer layer 2 of AlN, a 0.2 μm thick p-layer 5 of GaN, a 1.5 μm thick n-layer 4 of GaN with a low carrier concentration and a 2.2 μm thick n$^+$-layer 3 of GaN with a high carrier concentration. An electrode 8 of aluminum is in contact with the n$^+$-layer 3, and an electrode 7 of aluminum is in contact with the p-layer 5. The electrodes 7 and 8 separated from each other by a groove 9.

The light-emitting diode 10 of the above-mentioned structure was produced by the metalorganic vapor phase epitaxy (MOVPE) in the same manner as the example 1.

In the example 3, the order of forming the p-layer 5, the n-layer 4 and the n$^+$-layer 3 is only different from the example 1.

In the above-mentioned embodiment, the n-layer is of double-layer structure composed of an n$^+$-layer 3 of high carrier concentration and an n-layer 4 of low carrier concentration. However, these two layers may be replaced by a single n-layer.

In the case of double-layer structure, the n-layer should preferably have a carrier concentration of $1\times10^{14}$ to $1\times10^{17}$/cm$^3$ and a thickness of 0.5 to 2 μm. With a carrier concentration higher than $1\times10^{17}$/cm$^3$, the light-emitting diode decreases in light intensity. With a carrier concentration lower than $1\times10^{14}$/cm$^3$, the light-emitting diode radiates heat because of the increased serial resistance. With a thickness greater than 2 μm, the light-emitting diode radiates heat because of the increased serial resistance. With a thickness smaller than 0.5 μm, the light-emitting diode decreases in light intensity.

In addition, the n$^+$-layer 3 should preferably have a carrier concentration of $1\times10^{17}$ to $1\times10^{19}$/cm$^3$ and a thickness of 2 to 10 μm. A carrier concentration higher than $1\times10^{19}$/cm$^3$ is not desirable because crystal property becomes poor. With a carrier concentration lower than $1\times10^{17}$/cm$^3$, the light-emitting diode radiates heat because of the increased serial resistance. A layer thickness greater than 10 μm would cause the substrate to warp. With a layer thickness smaller than 2 μm, the light-emitting diode radiates heat because of the increased serial resistance.

What is claimed is:

1. A light-emitting semiconductor device using gallium nitride group compound comprising:
    an n-layer of n-type gallium nitride group compound semiconductor (Al$_x$Ga$_{1-x}$N, where $0 \leq x < 1$);
    a p-layer of gallium nitride group compound semiconductor (Al$_x$Ga$_{1-x}$N, where $0 \leq x < 1$) which exhibits the p-type conduction upon doping with p-type impurities and irradiation with electron rays, said p-layer joining to said n-layer;
    a first electrode for said n-layer which is formed on an upper surface of said p-layer so as to join to said n-layer, passing through a hole formed in said p-layer which extends from said upper surface of said p-layer to said n-layer; and
    a second electrode for said p-layer which is formed in a region opposite to said first electrode, said region being on said upper surface of said p-layer and being separated from said first electrode by a groove formed in said p-layer so as to extend from said upper surface of said p-layer to said n-layer.

2. A light-emitting semiconductor device using a gallium nitride group compound comprising:
    a sapphire substrate;
    a buffer layer of aluminum nitride (AlN) formed on said sapphire substrate;
    an n$^+$-layer of high carrier concentration, formed of an n-type gallium nitride group compound semiconductor (Al$_x$Ga$_{1-x}$N, where $0 \leq x < 1$) in which an electron density is high and which is doped with n-type impurities, formed on said buffer layer;

an n-layer of low carrier concentration, formed of an n-type gallium nitride group compound semiconductor ($Al_xGa_{1-x}N$, where $0 \leq x < 1$) in which an electron density is low and is not doped with n-type impurities, formed on said n+-layer;

a p-layer of a gallium nitride group compound semiconductor ($Al_xGa_{1-x}N$, where $0 \leq x < 1$) which exhibits p-type conduction and is doped with p-type impurities and irradiated with electron rays, said p-layer joined to said n-layer;

a first electrode, for said n+-layer, which is formed on an upper surface of said p-layer and passes through a first groove formed in said p-layer, said groove extending from said upper surface of said p-layer to said n+-layer, so as to join said first electrode to said n+-layer; and a second electrode for said p-layer which is formed in a region opposite to said first electrode, said region being on said upper surface of said p-layer and being separated from said first electrode by a second groove formed in said p-layer, said second groove extending from said upper surface of said p-layer to said n+-layer.

3. A light-emitting device according to claim 2, wherein irradiation with electron rays is carried out at an acceleration voltage of 1 kV to 50 kV and a sample current of 0.1 μA to 1 mA.

4. A light-emitting semiconductor device using a gallium nitride group compound comprising:
a sapphire substrate;
a buffer layer of aluminum nitride (AlN) formed on said sapphire substrate;
an n+-layer of high carrier concentration of n-type gallium nitride group compound semiconductor ($Al_xGa_{1-x}N$, where $0 \leq x < 1$) in which an electron density is high and which is doped with n-type impurities, formed on said buffer layer;
an n-layer of low carrier concentration, formed of an n-type gallium nitride group compound semiconductor ($Al_xGa_{1-x}N$, where $0 \leq x < 1$) in which an electron density is low and is not doped with n-type impurities, formed on said n+-layer;
an i-layer, formed of a semi-insulator or of a gallium nitride group compound semiconductor ($Al_xGa_{1-x}N$, where $0 \leq x < 1$), doped with p-type impurities, said i-layer joined to said n-layer;

a first electrode for said n+-layer which is formed on an upper surface of said i-layer and passes through a first groove formed in said i-layer, said first groove extending from said upper surface of said i-layer to said n+-layer, so as to join said first electrode to said n+-layer;

a p-type part in a specific region in said i-layer which has been converted into p-type conduction by irradiation with electron rays, said p-type part being formed such that said first electrode is insulated and separated from said p-type part by said i-layer; and a second electrode for said p-type part which is formed on an upper surface of said p-type part.

5. A light-emitting semiconductor device using a gallium nitride group compound comprising:
a sapphire substrate;
a buffer layer of aluminum nitride (AlN) formed on said sapphire substrate;
a p-layer of a gallium nitride group compound semiconductor ($Al_xGa_{1-x}N$, where $0 \leq x < 1$) which exhibits p-type conduction upon doping with p-type impurities and irradiation with electron rays, said p-layer being formed on said buffer layer;
an n-layer of an n-type gallium nitride group compound semiconductor ($Al_xGa_{1-x}N$, where $0 \leq x < 1$), said n-layer being formed on said p-layer;
a first electrode for said p-layer which is formed on an upper surface of said n-layer which passes through a first groove formed in said n-layer, said first groove extending from said upper surface of said n-layer to said p-layer so as to join to said p-layer; and
a second electrode for said n-layer which is formed in a region opposite to said first electrode, said region being on said upper surface of said n-layer and being separated from said first electrode by a second groove formed in said n-layer, said second groove extending from said upper surface of said n-layer to said p-layer.

6. A light-emitting device according to claim 5, wherein said n-layer is of a double-layer structure composed of an n-layer of low carrier concentration in which the electron density is low and an n+-layer of high carrier concentration in which the electron density is high, with the former layer joining to said p-layer, and said second electrode is formed on said n+-layer of high carrier concentration.

* * * * *